(12) United States Patent
Lukas

(10) Patent No.: US 6,713,675 B2
(45) Date of Patent: Mar. 30, 2004

(54) SATELLITE DIRECT RADIATING ELECTRONIC PACKAGING AND RELATED METHOD

(75) Inventor: Edward R. Lukas, Encino, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/841,902

(22) Filed: Apr. 25, 2001

(65) Prior Publication Data

US 2003/0159845 A1 Aug. 28, 2003

(51) Int. Cl.[7] ................................................ H02G 3/08
(52) U.S. Cl. ...................... 174/52.1; 361/719; 361/720; 361/725
(58) Field of Search ......................... 174/35 R, 52.1; 361/715, 719, 724, 727, 720, 725

(56) References Cited

U.S. PATENT DOCUMENTS 6,587,347 B1 * 7/2003 Lane et al. ................. 361/724
6,611,432 B2 * 8/2003 Blood ........................ 361/724

* cited by examiner

Primary Examiner—Hung V. Ngo
(74) Attorney, Agent, or Firm—Noel F. Heal

(57) ABSTRACT

A spacecraft electronics module in which electronics components (16) are housed in a box (12) that is mounted directly on a radiator panel structure, which includes a radiator panel (40') and a thermally conductive backing panel (42). The radiator panel structure is secured in such a way that the conductive backing panel (42) serves as a baseplate for the box (12) and heat from the electronics components is, therefore, conducted as directly as possible to the radiator panel (40'). Maintenance or replacement of the electronics components is effected without removal of the box from its installed location, by instead removing the radiator panel structure to permit direct access to components in the box.

4 Claims, 2 Drawing Sheets

SATELLITE DIRECT RADIATING ELECTRONIC PACKAGING AND RELATED METHOD

BACKGROUND OF THE INVENTION

This invention relates to generally to orbiting satellites and, more particularly, to packaging and cooling techniques for electronic modules carried on satellites. Satellites consist of various modules, which, largely for reasons of convenience and economy, are typically designed and manufactured by separate entities within a company, or by separate companies entirely. For example, a commonly accepted distinction is between an electronics module, such as a payload module, designed to perform a specific function in space, and the structure of a spacecraft designed to perform a support function for one or more modules that it carries. Conventionally, payload modules are constructed to be housed in six-sided metal payload boxes, which are secured to the spacecraft, usually by bolting down onto part of the spacecraft structure.

Each payload box typically houses heat-producing electronics components, which must be maintained below a maximum operating temperature to ensure that they operate for a desired operating life without defects. In conventional satellite design, each box provides a thermal path from the heat-producing components to a metal baseplate on one face of the box. When the payload box is integrated into the satellite, this baseplate is secured to a heat-conducting structure on the spacecraft, including another metal plate referred to as a doubler plate, which further spreads the thermal path laterally, a honeycomb structure with embedded heat pipes, and a heat radiator panel. Heat from the payload components conducts through the baseplate and is spread by the doubler plate, the honeycomb structure and the heat pipes across a larger area of the radiator panel, from which the heat is radiated into space.

There are two principal drawbacks to the conventional satellite structure described above. First, the thermal path between the heat-producing components and the radiator panel includes a number of thermal resistance components that together result in a lower radiated power from the panel and a higher operating temperature of the components. In addition, the spacecraft structure that contributes significantly to the thermal path resistance, also contributes to the total mass and the cost of the spacecraft. However, so long as the baseplate interface between payload boxes and the spacecraft structure is mandated by convention, these thermal resistance components cannot be eliminated or easily reduced. The second drawback of the conventional satellite structure as described is that any modification of components in a payload box can be accomplished only by completely removing the box from the spacecraft. Replacement of components or circuit cards during integration and testing of the satellite is, therefore, a time-consuming and expensive procedure. Similarly, replacement of faulty components immediately before launch of the satellite, or while the satellite is in orbit, is equally difficult and time-consuming.

Ideally, a satellite should be designed to minimize the thermal resistance between heat-producing components and a heat-radiating panel, to minimize spacecraft mass, and to provide convenient access to payload components for maintenance and replacement. As will become apparent from the description that follows, the present invention achieves goals.

BRIEF SUMMARY OF THE INVENTION

The present invention resides in a satellite structure in which each payload box has five conventional faces and a sixth face that serves as part of a direct radiator panel structure and as an access panel for maintenance of components housed in the box.

Briefly, and in general terms, the invention may be defined as a spacecraft module comprising one or more heat-generating electronics components; a metal box enclosing the electronics components and having one face that forms an opening to provide access to the box; and a heat radiating panel, including a heat-conductive backing plate for installation over the opening in the box, with the backing plate in a direct heat-conductive relationship with the electronics components. The heat radiating panel is removable to facilitate access to the electronics components, and the thermal resistance between the electronics components and the heat radiating panel is minimized by the direct transmission of heat to the radiator, without any intervening heat-conducting structures. Therefore, both the mass and the cost of each module, and of the entire spacecraft, are significantly reduced. More specifically, the metal box has five solid faces and a sixth face that forms the opening to provide access to the box.

The structure of the invention may also be defined as a spacecraft module, comprising a spacecraft structure, including a cavity that presents an opening at an external surface of the structure; an electronics module box having four contiguous faces forming sidewalls, a fifth face adjoining the sidewalls and sixth face that includes an opening for access to the module box, wherein the module box is installed in the cavity of the spacecraft structure, with the opening to the module box approximately coplanar with the opening to the cavity in the spacecraft structure. The structure of the invention further comprises a plurality of electronics components mounted on circuit boards and installed in the module box; a supporting structure installed in the module box, to provide mechanical support for the circuit boards and a thermal path for heat generated in the electronics components; a removable radiator panel structure, including a thermally conductive backing plate; and a plurality of fasteners to attach the radiator panel structure to the spacecraft structure. When attached to the spacecraft, the radiator panel structure covers the opening to the cavity in the spacecraft structure and covers the module box opening, such that the backing plate of the radiator panel is placed in good thermal contact with the supporting structure in the module box. Heat generated by the electronics components is transmitted directly from the supporting structure to the radiator panel structure, and the thermal resistance between the supporting structure and the radiator panel structure is minimized. An important benefit is that access to the electronics components is easily effected by removal of the radiator panel structure.

The invention may also be defined as a method for reducing the mass of, and improving maintenance access to, a spacecraft module. The method comprises the steps of providing an electronics module box, with one face missing to define an opening for maintenance of electronics components enclosed therein; installing electronics components in the electronics module box; installing the electronics module box in a spacecraft, with the opening facing out; and installing a radiator panel over the opening in the box, wherein the panel includes a backing plate installed in thermal contact with the electronics components enclosed in the box. Spacecraft mass is significantly reduced by ensuring more direct contact between the electronics components and the radiator panel, and maintenance access is more easily effected by removal of the radiator panel. Accordingly, the method may further comprise the steps of removing the radiator panel; repairing electronics components in the box without removing the box from the spacecraft; and replacing the radiator panel.

It will be appreciated from the foregoing summary that the present invention represents a significant advance in the field of spacecraft architecture. In particular, the invention achieves significant reductions in mass and cost by eliminating components that are conventionally employed to couple an electronics module box to a spacecraft structure. Direct coupling of heat generated by electronics components to the radiator panel also facilitates access to the electronics components, by removal of the panel. Other aspects and advantages of the invention will become apparent from the following more detailed description, taken in conjunction with the accompanying drawings.

DETAILED DESCRIPTION OF THE INVENTION

Figure 1:
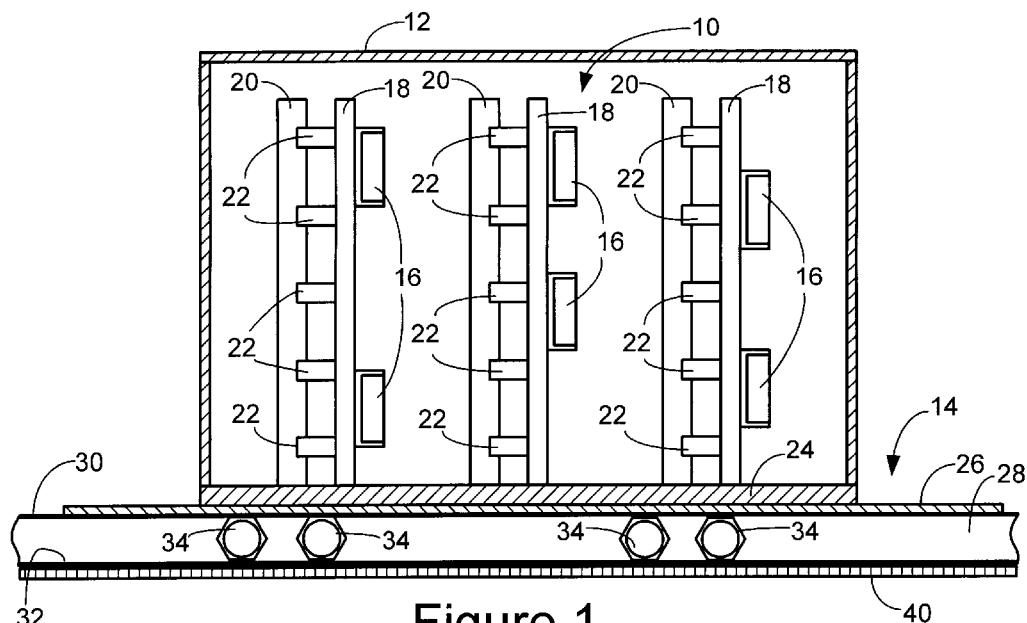
FIG. 1 is a diagrammatic view, partly in cross section, of typical satellite payload module box of the prior, shown in relation to a radiator panel structure.

As shown in the drawings for purposes of illustration, the present invention pertains to orbiting satellites, and particularly to techniques for optimizing satellite structures for thermal design and ease of maintenance. As shown diagrammatically in FIG. 1, a conventional satellite includes payload or other electronics modules, one of which is indicated by reference numeral 10. Each module is housed in a metal box 12 that is mounted on a heat-conducting structure 14 of the satellite. The electronics module 10 includes heat-producing components 16 mounted on circuit boards 18, each of which is shown as being connected to a stiffener panel 20 by fasteners 22. The circuit boards 18 are made from dielectric materials that are not good conductors of heat. Some heat may be transferred through any metalization layer on the board, but the stiffener panels 20 also serve as thermal plates, providing the principal thermal path to a metal baseplate 24.

Heat from the components 16 is conducted into the circuit boards 18 and stiffener panels 20, and from there to the baseplate 24, which spreads the heat laterally and is mounted in thermal contact with the heat-conducting structure 14. The latter structure typically includes another metal plate 26, usually referred to as doubler plate because it is approximately double the area of the baseplate 24. Beneath and in thermal contact with the doubler plate 26 is a honeycomb structure 28 that includes two thin metal outer layers 30 and 32 and a number of embedded heat pipes, four of which are shown at 34. The honeycomb structure 28 and the heat pipes 34 further spread the heat laterally over a relative large area. The lower outer layer 32 of the honeycomb structure 28 is in thermal contact with a radiator panel 40, which both reflects incident radiation and radiates heat from the payload module components to space.

Depending on the nature of the electronic components 16, there is a particular desired maximum temperature that must not be exceeded. For semiconductor components, the critical temperature is the junction temperature of the components. For example, gallium arsenide semiconductors are typically operated at a junction temperature not exceeding 125° C. Higher operating temperatures can result in a lower product life and possible component malfunctions.

For convenience, all of the components of the payload module 10, including the box 12 and the baseplate 24, are traditionally manufactured and supplied by one manufacturing or engineering group, while the spacecraft components are designed and built by a separate group, and include the heat-conducting structure 14. Each payload module 10 in its box 12 can then be conveniently bolted onto the spacecraft structure. Although this approach is convenient, it has two significant drawbacks. The first is that the thermal path from the electronic components 16 to the radiator panel 40 must pass through the thermal resistance of a number of components before reaching the panel 40. The combined thermal resistances of the baseplate 24, doubler plate 26, honeycomb structure 28 and heat pipes 34, result in temperature differential that would best be eliminated because it causes the radiator panel 40 to operate at a lower temperature. Therefore, a larger panel area is needed to dissipate a given amount of heat. A second drawback of the structure of FIG. 1 is that maintaining or replacing the electronic components 16 is extremely inconvenient and, therefore, costly. Access through the baseplate 24 is not a practical option because the presence of the honeycomb structure 28, the heat pipes 34 and the doubler plate 26 preclude direct access from this direction. Access through the top of the box 12 is also usually not a practical option because the box is typically installed with its top facing into an interior space of the satellite. The only alternative is to completely remove the box 12 and its enclosed components. This is a time-consuming and costly procedure but it must nevertheless be undertaken during integration and testing of the satellite if malfunctions are detected in any payload module. Ease of module access while the satellite is in orbit would also be highly desirable, to allow astronauts to repair or upgrade the electronics components 16. For the conventional structure shown in FIG. 1, the only option in space is to remove the module box 12, make the necessary repairs, and then replace the box in the satellite structure.

Figure 2:
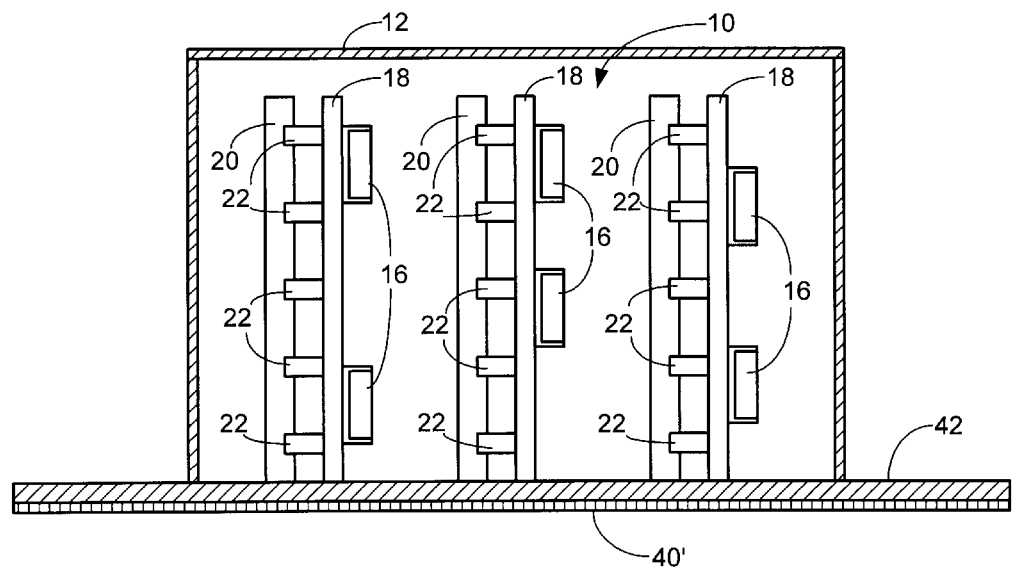
FIG. 2 is a view similar to FIG. 1, but showing the modified payload module box and radiator panel in accordance with the present invention.

In accordance with the present invention, many of heat-conducting components of the prior art structure are eliminated and the payload module 10 is coupled more closely to a modified radiator panel 40' (FIG. 2). The resulting structure provides a lower thermal resistance between the electronics components 16 and the radiator panel 40'. The mass of the satellite is significantly reduced and the radiator panel 40' operates more efficiently. An additional important benefit is that access to the electronics components 16 is easily provided by making all or part of the radiator panel 40' removable.

As shown in FIG. 2, the modified radiator panel 40' is attached to a backing plate 42, which serves as a baseplate for the module box 12. The circuit boards 18 and stiffener plates 20 are placed in good thermal contact with the panel backing plate 42, and heat spreads laterally into the backing plate from the circuit boards and stiffener plates, and is radiated from the radiator panel 40'. Elimination of the baseplate 24, the doubler plate 26, the honeycomb structure 28 and the heat pipes 34 eliminates a temperature drop of between 12° C. and 20° C. Therefore, the modified radiator panel 40' operates at a higher temperature than the conventional panel 40. Because the heat dissipated by radiation varies in proportion to the fourth power of the absolute temperature, operating at a higher panel temperature means that the panel area can be significantly reduced while still dissipating the same amount of heat generated in the electronics modules 16.

Figure 3:
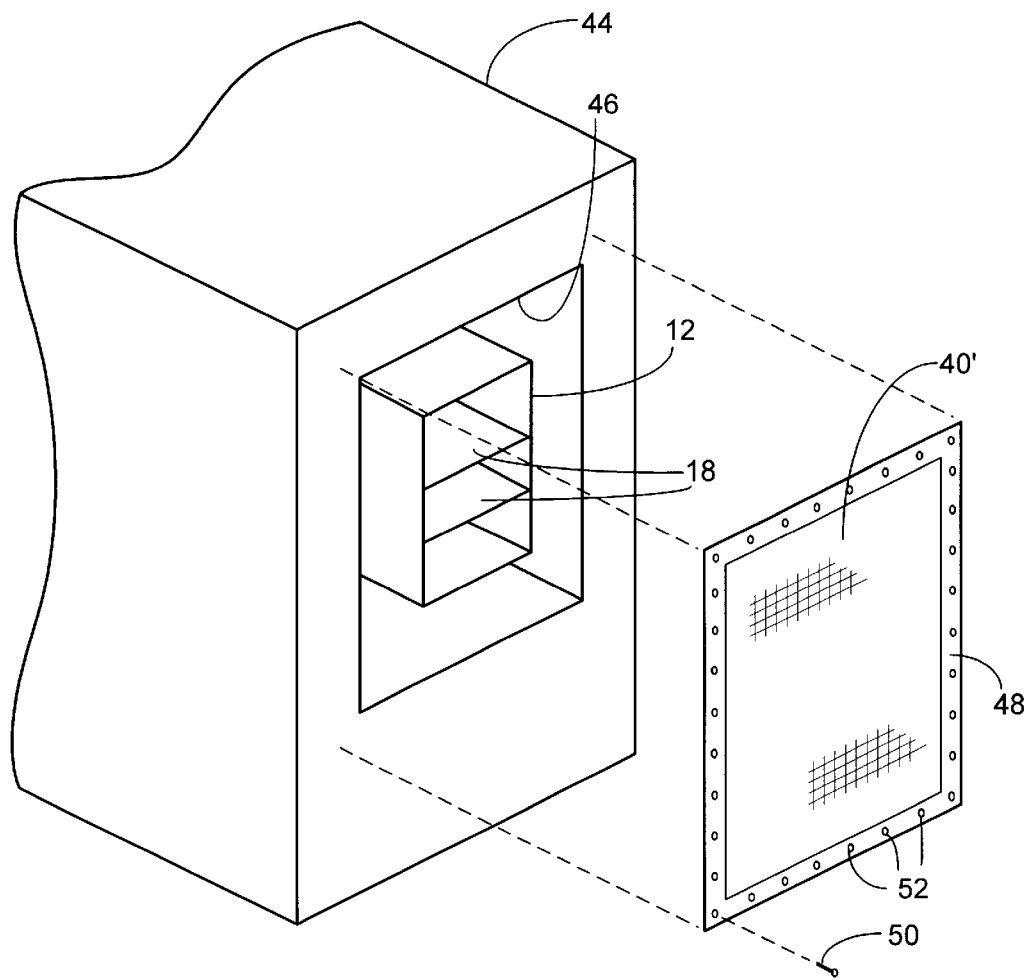
FIG. 3 is a simplified isometric view of a payload module box and radiator panel installed in portion of a satellite spacecraft in accordance with the present invention.

FIG. 3 shows a typical application of the invention, in which a module box 12 is installed within a spacecraft structure, a portion of which is indicated at 44. The box 12 is secured in a cavity 46 in the spacecraft structure 44, by means not shown in the figure, such as by conventional mounting brackets securing the box to the walls of the cavity. The radiator panel 40', including its backing plate 42

(not visible in FIG. 3), is larger in area than the bottom of the box 12, and includes a flange 48 around its periphery. The radiator panel 40' is secured to the spacecraft structure 44 by screws or other conventional fasteners (one of which is indicated at 50), through holes 52 in the flange 48. When the radiator panel 40' is attached to the spacecraft structure 44, the backing plate 42 of the panel is held in good thermal contact with the circuit boards 18 and stiffener panels 20 in the module box 12. Heat is then conducted with less resistance into the radiator panel 40', and radiated directly into space.

It will be apparent from the example shown in FIG. 3 that use of the invention greatly facilitates maintenance, repair and replacement of the electronics modules 16 in a payload module box 12. Whether the spacecraft is located in a test facility, on a launch vehicle, or even in space, removal of the modified radiator panel 40' provides exceptionally easy access to the electronic components 16 and the circuit boards 18. Removal of the box 12 from the spacecraft is rarely, if ever, required.

The baseplate 24 of a conventional payload module box 12 has a mass of approximately 18 pounds (8.2 kg). Elimination of the doubler plate 26, honeycomb structure 28 and heat pipes 34 represent additional mass savings. Total mass savings achieved by use of the invention for a typical payload module box amount to twenty percent or more.

A further reduction in mass is achieved because the modified radiation panel 40' operates at a temperature 12°–20° C. higher than the conventional panel 40. Because the power dissipation (in watts per unit area) is increased at higher temperatures, the area of the panel 40' can be correspondingly smaller than that of the panel 40 used to cool the conventionally constructed module 10.

The embodiment of the invention illustrated shows the electronics components 16 and circuit boards installed in a module box 12, with the modified radiator panel 40' installed as an access door positioned in thermal contact with the components or circuit boards. It will be understood that other embodiments of the invention are possible. For example, electronic components might be attached to the rear face of the radiator panel 40', and be removable with the panel for maintenance or replacement.

It will be appreciated from the foregoing that the present invention represents a significant advance in satellite design. In particular, the invention provides a satellite of lower mass and lower cost, and the ability to allow convenient repair and replacement of electronics modules, either on the ground or in space. It will also be appreciated that, although a specific embodiment of the invention has been described in detail for purposes of illustration, various modifications may be made without departing from the spirit and scope of the invention. Accordingly, the invention should not be limited except as by the accompanying claims.

What is claimed is:

1. A spacecraft module, comprising:

one or more heat-generating electronics components;

a metal box enclosing the electronics components and having one face that forms an opening, to provide access to the box; and a heat radiating assembly, including a heat radiating panel having an inner face and an outer face the outer face functioning to radiate heat directly into space, and further including a heat-conductive backing plate for installation over the opening in the box, with the backing plate being generally co-extensive with and attached to the inner face of the heat radiating panel, the backing plate also being in a direct heat-conductive relationship with the electronics components;

wherein the heat radiating assembly is independently removable without removal of the metal box, to facilitate access to the electronics components;

whereby thermal resistance between the electronics components and the heat radiating panel is minimized, allowing use of a smaller radiating panel area to emit a given amount of heat energy, total spacecraft mass is reduced, and maintenance access to the electronics components is facilitated.

2. A spacecraft module as defined in claim 1, wherein:

the metal box has five solid faces; and the heat radiating assembly also functions as an independently removable sixth face of the metal box.

3. A spacecraft module, comprising:

one or more heat-generating electronics components mounted on at least one circuit board;

a metal box enclosing the electronics components and having an opening to provide access to the box;

at least one thermal panel attached to the at least one circuit board, to provide a thermal path; and a heat radiating assembly, including a heat radiating panel having an inner face and an outer face, the outer face functioning to radiate heat directly into space, and further including a heat-conductive backing plate for installation over the opening in the box, wherein the backing plate is generally co-extensive with and attached to the inner face of the heat radiating panel, and with the backing plate in thermal contact with the at least one circuit board and the at least one thermal panel;

wherein the heat radiating assembly is independently removable without removal of the metal box, to facilitate access to the at least one circuit board and the electronics components;

whereby thermal resistance between the electronics components and the heat radiating panel is minimized, allowing use of a smaller radiating panel area to emit a given amount of heat energy, total spacecraft mass is reduced, and maintenance access to the electronics components is facilitated.

4. A spacecraft module, comprising:

a spacecraft structure, including a cavity that presents an opening at an external surface of the structure;

an electronics module box having four contiguous faces forming sidewalls, a fifth face adjoining the sidewalls and an opening opposite the fifth face, for access to the module box, wherein the module box is installed in the cavity of the spacecraft structure, with the opening to the module box approximately coplanar with the opening to the cavity in the spacecraft structure;

a plurality of electronics components mounted on circuit boards and installed in the module box;

a supporting structure installed in the module box, to provide mechanical support for the circuit boards and a thermal path for heat generated in the electronics components;

a removable radiator panel structure, including a heat radiating panel having an inner face and an outer face, the inner face functioning to radiate heat directly into space, and further including a thermally conductive backing plate that is generally co-extensive with and attached to the inner face of the heat radiating panel; and a plurality of fasteners to attach the radiator panel structure to the spacecraft structure in such a way as to cover the opening to the cavity and to cover the module box, wherein the backing plate of the radiator panel is placed in thermal contact with the supporting structure in the module box, whereby heat generated by the electronics components is transmitted directly from the supporting structure to the radiator panel structure, and whereby thermal resistance between the supporting structure and the heat radiating panel is minimized, allowing use of a smaller radiating panel area to emit a given amount of heat energy, total spacecraft mass is reduced, and access to the electronics components is easily effected by removal of the radiator panel structure.

* * * * *